(12) United States Patent
Noelscher et al.

(10) Patent No.: US 7,872,729 B2
(45) Date of Patent: Jan. 18, 2011

(54) FILTER SYSTEM FOR LIGHT SOURCE

(76) Inventors: Christoph Noelscher, Wielandstrasse 6, 90419 Nuremberg (DE); Sven Trogisch, Ruscheveg 33, 01109 Dresden (DE)

( * ) Notice: Subject to any disclaimer, the term of this patent is extended or adjusted under 35 U.S.C. 154(b) by 1175 days.

(21) Appl. No.: 11/513,502

(22) Filed: Aug. 31, 2006

(65) Prior Publication Data
US 2008/0055712 A1 Mar. 6, 2008

(51) Int. Cl.
*G03B 27/42* (2006.01)
(52) U.S. Cl. .............................. 355/53; 355/71; 355/67
(58) Field of Classification Search ............... 250/492.2; 359/308; 355/53, 71
See application file for complete search history.

(56) References Cited

U.S. PATENT DOCUMENTS

| | | | |
|---|---|---|---|
| 2003/0006383 A1* | 1/2003 | Melnychuk et al. | 250/504 R |
| 2003/0142280 A1 | 7/2003 | Bakker et al. | |
| 2004/0013226 A1* | 1/2004 | Bakker et al. | 378/34 |
| 2005/0254029 A1 | 11/2005 | Banine et al. | |
| 2006/0012761 A1* | 1/2006 | Bakker et al. | 355/30 |
| 2007/0145297 A1* | 6/2007 | Freriks et al. | 250/492.2 |

OTHER PUBLICATIONS

Fan, Yu-Jen, "Out of Band Filtering Properties of Projection Optics," 12 pages.
Keller-Rudek, et al. "MPI-Mainz-UV-VIS Spectral Atlas of Gaseous Molecules." [on-line] downloaded Jan. 23, 2007 www.atmosphere.mpg.de/spectral-atlas-mainz, 3 pages.

* cited by examiner

*Primary Examiner*—Edward J Glick
*Assistant Examiner*—Mesfin T Asfaw

(57) ABSTRACT

The invention is concerned with a filter system for a light source in a lithography process for the production of semiconductor devices with a flowing absorber gas for at least one wavelength ($\lambda$) in the range between 20 to 250 nm, the flowing absorber gas intersecting the light path emitted by the light source. Furthermore, the invention is concerned with a lithography apparatus for processing semiconductor substrates, the use of a filter system, a method for filtering light and a semiconductor device manufactured by the method.

37 Claims, 8 Drawing Sheets

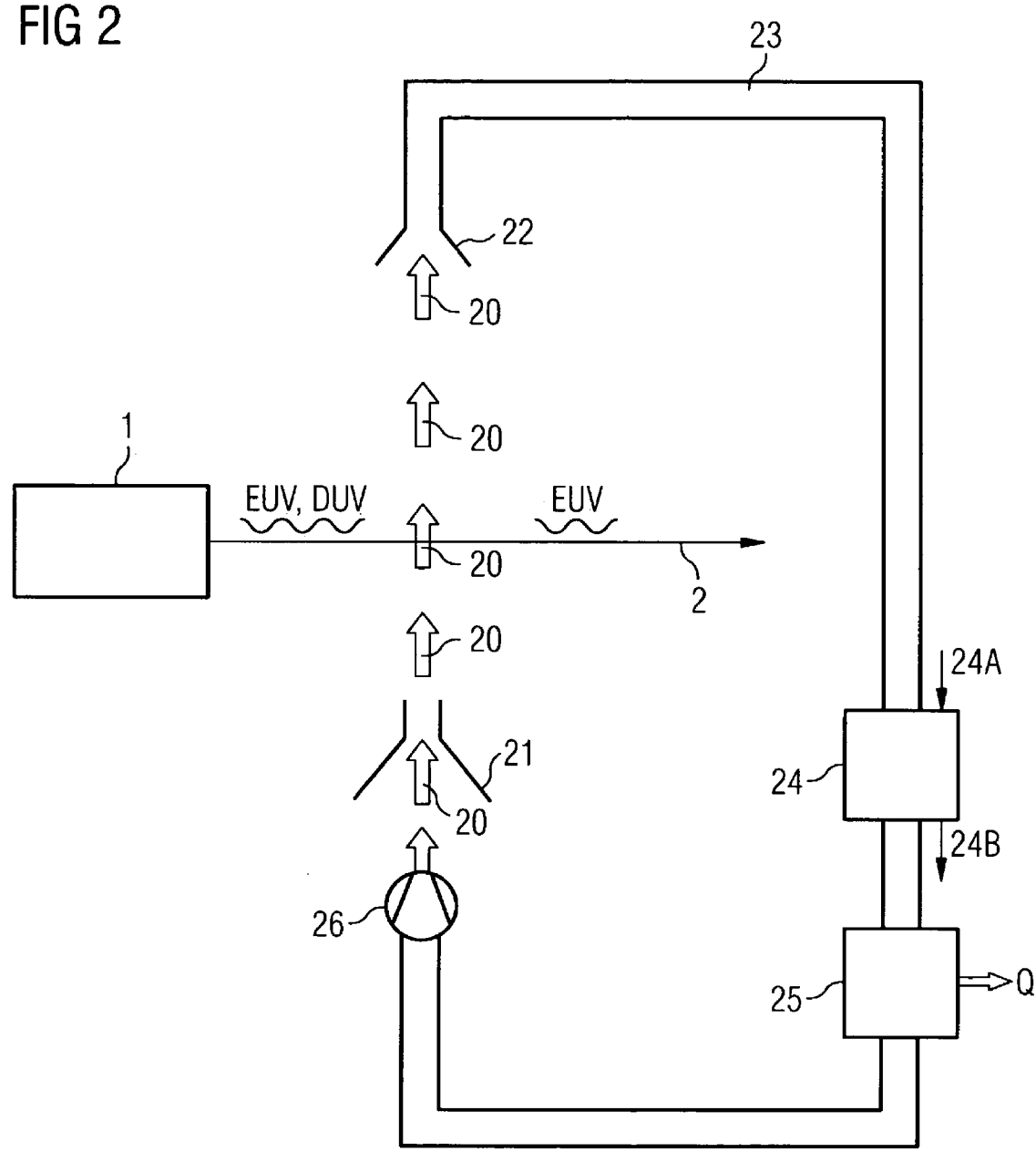

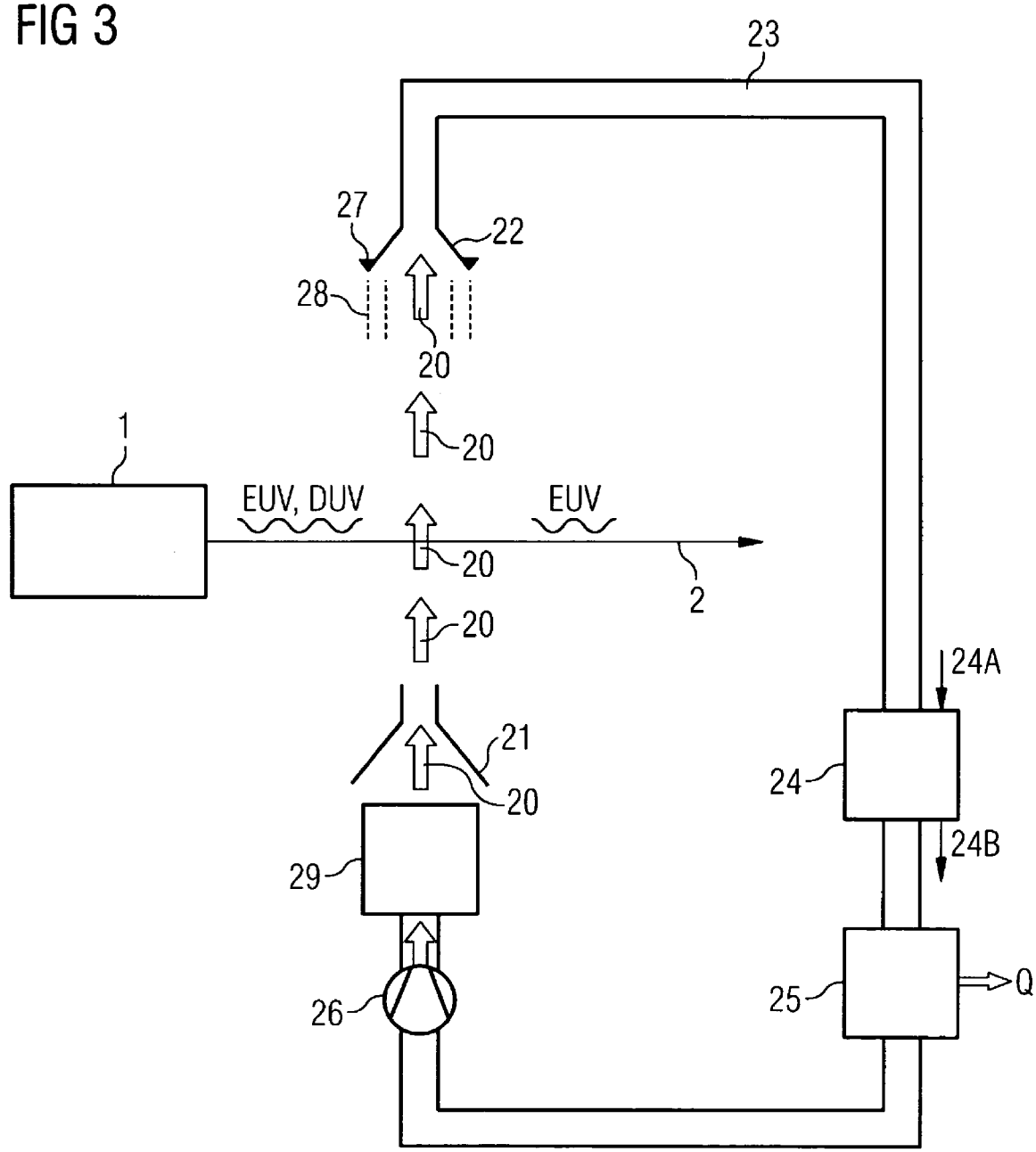

FILTER SYSTEM FOR LIGHT SOURCE

TECHNICAL FIELD

This invention relates generally to a filter system for a light source in a lithography process in the production of semiconductor devices. Furthermore, the invention also relates to a filtering method and semiconductor devices manufactured with the filtering method.

BACKGROUND

The current processes in the field of lithography requires shorter and shorter wavelengths because of the increasing trend to manufacture smaller and smaller structures for semiconductor devices such as DRAM chips. Usually, a resist, i.e. a chemical substance sensitive to light, is illuminated by a light source via a mask. A pattern on the mask (either a reflective mask or a transmission mask) is transferred to the light sensitive resist which in turn is used in further processing steps to generate the structures on a substrate.

For the illumination light with wavelengths of 248 nm, 193 nm or 157 nm are used. Those wavelengths are generally termed as deep UV light.

The latest step in the direction of smaller wavelengths is the usage of extreme ultra violet (EUV) light with wavelengths between 1to 50nm, in particular with a wavelength of 13.4nm. This EUV light is usually produced by the generation of plasmas. It is known e.g. to generate EUV light with the wavelength of 13.4nm with a Xenon gas ignited by a pulsed Nd:YAG Laser to produce a plasma.

The latest step in the direction of smaller wavelengths is the usage of extreme ultra violet (EUV) light with wavelengths between 1 to 50 nm, in particular with a wavelength of 13.4 nm. This EUV light is usually produced by the generation of plasmas. It is known e.g. to generate EUV light with the wavelength of 13.4 nm with a Xenon gas ignited by a pulsed Nd:YAG Laser to produce a plasma.

But it is also known that such EUV generating plasmas emit light at other wavelengths, in particular in the deep ultra violet range (100 to 300 nm). Resists used in lithography are generally not only sensitive for light of one particular wavelength but for light in a range of wavelengths. Therefore, a resist for EUV lithography exhibits also sensitivity for light at DUV wavelengths reducing the quality of the lithography result.

SUMMARY OF THE INVENTION

The invention is concerned with a filter system and a method for filtering light from a light source in a lithography process in the production of semiconductor devices with a flowing absorber gas for at least one wavelength λ in the range between 30 to 250 nm, the flowing absorber gas intersecting the light path emitted by the light source. Furthermore, the invention is concerned with semiconductor devices, manufactured with said method.

It is the purpose of the absorber gas to filter out some of the light at higher wavelengths.

BRIEF DESCRIPTION OF THE DRAWINGS

Embodiments and advantages of the invention become apparent upon reading of the detailed description of the invention, and the appended claims provided below, and upon reference to the drawings.

FIG. 2 schematically shows a third embodiment of a filter system using a free flowing absorber gas stream;

FIG. 3 schematically shows a fourth embodiment being a variation of the first embodiment;

DETAILED DESCRIPTION OF ILLUSTRATIVE EMBODIMENTS

The following embodiments of the invention are described in connection with an extreme ultra violet (EUV) system used in a lithographic process in the manufacturing of semiconductor devices. Examples for semiconductor devices which can be manufactured by such systems are DRAM memory chips, NROM memory chips and microprocessors.

Figure 1:
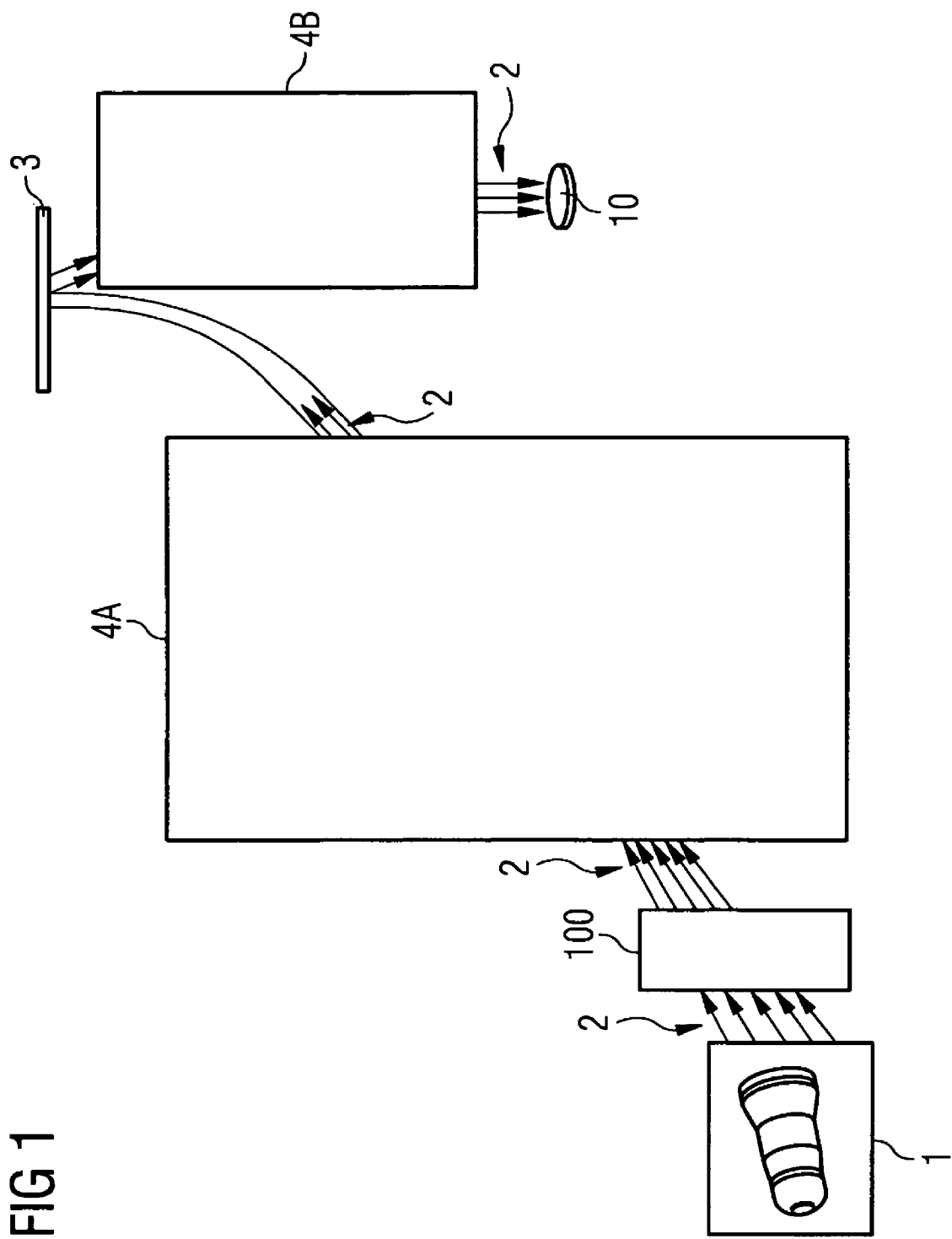
FIG. 1 schematically shows a first embodiment of a EUV lithography system.

As depicted in FIG. 1 a light source 1 emits EUV radiation along a light path 2 primarily at 13.4nm from Xenon plasma generated within the source 1.

As depicted in FIG. 1 a light source 1 emits EUV radiation along a light path 2 primarily at 13.4 nm from Xenon plasma generated within the source 1.

It is important to note that the invention is not limited to such light sources 1 because light sources 1 for other wavelengths can also emit considerable energy at EUV wavelengths so that the filter system according to the invention can be used for other systems as well.

From the light source 1 a light cone is emitted along the light path 2 to a wafer 10. It is the aim of the lithography system to generate structures on the wafer 10 in a principally known way. The structures are imprinted on a reflection mask 3 which guides the light from the light source 1 onto the wafer 3. The light projected onto the wafer 10 interacts with an optical sensitive layer (resist).

In FIG. 1 a first mirror system 4A is shown which guides the light along the light path 2 from the source 1 to the mask 3.

After the mask 3 a second mirror system 4B is positioned guiding the light to the wafer 10. Typically the mirror systems 4A, 4B comprise a plurality of mirrors.

Behind the light source 1, but before the first mirror system a filter system 100 is positioned. In the following some exemplary embodiments of such a filter system 100 are described.

Figure 1A:
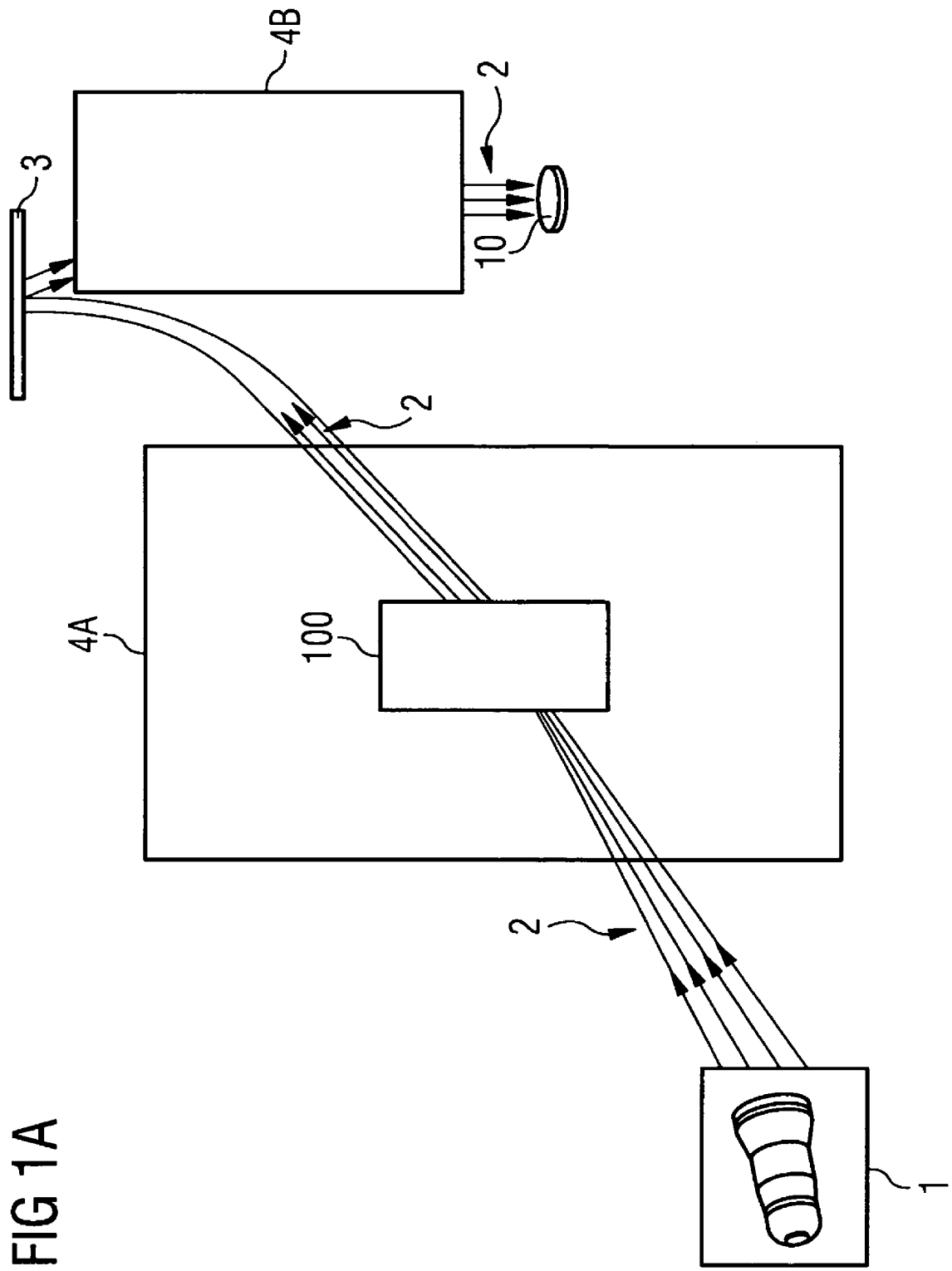
FIG. 1A schematically shows a second embodiment of a EUV lithography system.

In FIG. 1A a second embodiment of an EUV lithography system is schematically shown. In this the filter system 100 is positioned within the first mirror system 4A, here at an intermediate focus point.

In connection with FIG. 1 and FIG. 1A the filter system 100 is shown as a distinct unit, positioned within the EUV lithography system. Alternatively, the flowing absorber gas 20 can be flowing throughout the internal space of the EUV lithography system, so that the light path 2 takes a long way through the absorber gas 20. To protect mirrors in the mirror systems 4A, 4B, the region around the mirrors could be kept free from the absorber gas 20 by selectively pumping away absorber gas 20 around mirrors or by selectively removing the absorber gas 20 with an inert gas flow.

In FIG. 2 the filter system 100 as a part of the lithography system is shown schematically. Between the light source 1 and the rest of the system (e.g. mirrors, mask, wafer etc.) a free flowing absorber gas 20 is introduced in the light path 2. In this first embodiment the absorber gas 20 is introduced between the light source 1 and a not depicted first mirror of the lithography system. Alternatively, it is possible to introduce the absorber gas 20 stream exclusively or additionally at other locations in the light path 2.

As mentioned in context with FIG. 1, the light source 1 emits EUV light but also other wavelengths (e.g. DUV), especially in the range between 20 to 250 nm. Therefore, the spectrum of the light source 1 has a broader spectrum as desired.

It is the purpose of the absorber gas 20 to filter out the wavelengths in the range between 20 and 250 nm so that predominantly EUV light is emitted. The absorber gas 20 is chosen to have an effective absorption cross section for the undesirable wavelengths.

In this context absorption cross section is defined by the Lambert-Beer law describing the attenuation of light by a homogeneous absorbing system:

$$I = I_0 \exp(\sigma\, d\, n)$$

where $I_0$ and $I$ are the incident and transmitted light intensities, d is the absorption path length (in cm), n is the concentration of the absorber (in molecule/cm$^3$), and $\sigma$ is the absorption cross section (in cm$^2$ molecule$^{-1}$).

In the described embodiment the absorber gas 20 is phosphine (PH$_3$). Alternatively, benzene (C$_6$H$_6$), carbon disulfide (CS$_2$), hydrogen, ethylene (CH$_2$CH$_2$), helium, neon, argon, krypton or xenon could be used.

Furthermore, it is within the scope of the invention to use mixtures of two or more different absorber gases 20. The composition of the gas mixture can be chosen to optimize the absorption properties. This and other properties of the absorber gas 20 will be discussed in connection with FIG. 6.

In this first embodiment the absorber gas 20 is a free flowing stream intersecting the light path 2. In this embodiment the flow is essentially perpendicular to the light path 2. If it is necessary, the flow direction can be at an angle to the light path 2.

The internal space of the lithography system is usually evacuated, i.e. operating at a vacuum (e.g. a range between 10 mbar to 10$^{-10}$ mbar). Therefore, the absorber gas 20 flow expands into the vacuum and has to be removed sufficiently before an undesired contamination of other equipment takes place. A number of measures can be taken to that effect. A person skilled in the art understands that those measures shown in the figures can be employed individually or in any possible combination.

First of all the gas flow of the absorber gas 20 is directed by a nozzle 21 to give the gas flow a directed profile. For the purpose of this embodiment it is deemed advantageous that the drift velocity of the absorber gas 20, i.e. the velocity from the inlet of the absorber gas 20 to the outlet, is at least as high as the thermal velocity, i.e. the velocity of a molecule in one direction due to thermal fluctuation. In the limit, the thermal fluctuations would widen the absorber gas stream to a cone with a cone angle of 90°.

The thermal velocity in one direction can assumed to be $$v_{thermal} = \sqrt{\frac{RT}{M}}$$

M is the molecular weight, R is the gas constant, and T is the temperature.

At room temperature phosphine would have a thermal velocity of approximately 270 m/s. This would be the minimum velocity of the drift velocity for this particular absorber gas and at this temperature. Increasing the drift velocity, by increasing e.g. the pressure difference, would result in a narrower cone angle of the absorber gas stream 20. A doubling of the drift velocity to 540 m/s would reduce the cone angle from 90° to 53°. The cone angle can be calculated from $$coneangle = 2*\arctan\left(\frac{v_{thermal}}{v_{drift}}\right)$$

The relationship for the thermal velocity shows that a cooling of the absorber gas 20 results in a lowering of the velocity. This would result in a smaller cone angle.

In the embodiment depicted in FIG. 2 the absorber gas 20 is recycled by recycling means 23. Therefore, the free flowing absorber gas 20 is collected by collector means 22 (e.g. stainless steel plates).

The composition of the absorber gas 20 will be altered by the irradiation in the light path 2. Therefore, a filter unit 24 is used in the recycle 23 to filter out undesired parts of the absorber gas. The filter unit 24 can use e.g. membranes, distillation, absorption, adsorption, condensation or a combination of those unit operations. Fresh absorber gas 24A might be introduced to make up for losses 24B.

Since absorber gas is heated by the light emitted from the light source 1, a cooler 25 is employed to bring the recycled absorber gas 20 into the appropriate temperature range. The cooler 25 can be integrated into the recycle 23, i.e. the tubing itself would act as cooler 25. The temperature in this example is room temperature. Alternatively, the temperature can be lower than room temperature, limiting the thermal velocity. Alternatively, the temperatures can be higher. The absorber gas 20 can have temperatures between 10 K and 600 K.

The whole recycle of the absorber gas 20 is maintained by a pump system 26. It might be advantageous to operate the pump system 26 in a pulsed mode to synchronize the introduction of the absorber gas 20 with a pulsed light source 1. Typical pulse rates are in the range of 4 to 10 kHz.

The advantageous effect of the embodiment is a much higher ratio of EUV light reaching the resist on the wafer 10 than without the absorber gas.

In a typical lithograph system with an EUV plasma light source 1, only 50% of the EUV intensity reaches the wafer. This situation can be improved by employing embodiments of the invention.

If the input absorption of EUV light is set to 10%, the absorption of EUV (aEUV) can be calculated from $$10\% = I_{EUV\text{-}0} \cdot (1-\exp(-aEUV))$$

With the EUV intensity without filter $I_{EUV-0}=1$: aEUV=0, 1054

Setting a ratio of the absorption coefficient ratio between DUV and EUV to 20, the absorption coefficient for DUV can be derived from $$20 = \frac{aDUV}{aEUV} \Rightarrow aDUV = 2.1072$$

The absorption of DUV is then $1-IDUV_0 \cdot (\exp(-aDUV)) = 87.8\%$

Consequently, the output DUV light compared to the input is $-\exp(-aDUV) = 12.2\%$ The ratio of DUV output to EUV output is then 6.8%.

An absorber gas with an absorption ratio aDUV/aEUV of 20 and an input absorption for EUV light of 10% would absorb 88% of the DUV light. This would be a ratio of DUV/EUV output of 6.8%, down from 50%.

In FIG. 3 a modification of the first embodiment is shown so that reference is made to the description of FIG. 2. Unlike in the first embodiment, the absorber gas 20 is ionized so that it can be controlled by an electric field 28 (only schematically depicted in FIG. 3). The absorber gas flow and the electric field are oriented in the same direction.

The absorber gas 20 is ionized by an ionizer 29 which couples e.g. microwave or RF radiation into the absorber gas.

The first embodiment is altered by adding an electrical field means 27 to the collector means 22. By applying the appropriate polarity to the field means 27, the ionized absorber gas 20 stream is directed towards the collector means 22. This helps in reducing possible internal contamination of the system.

Figure 4:
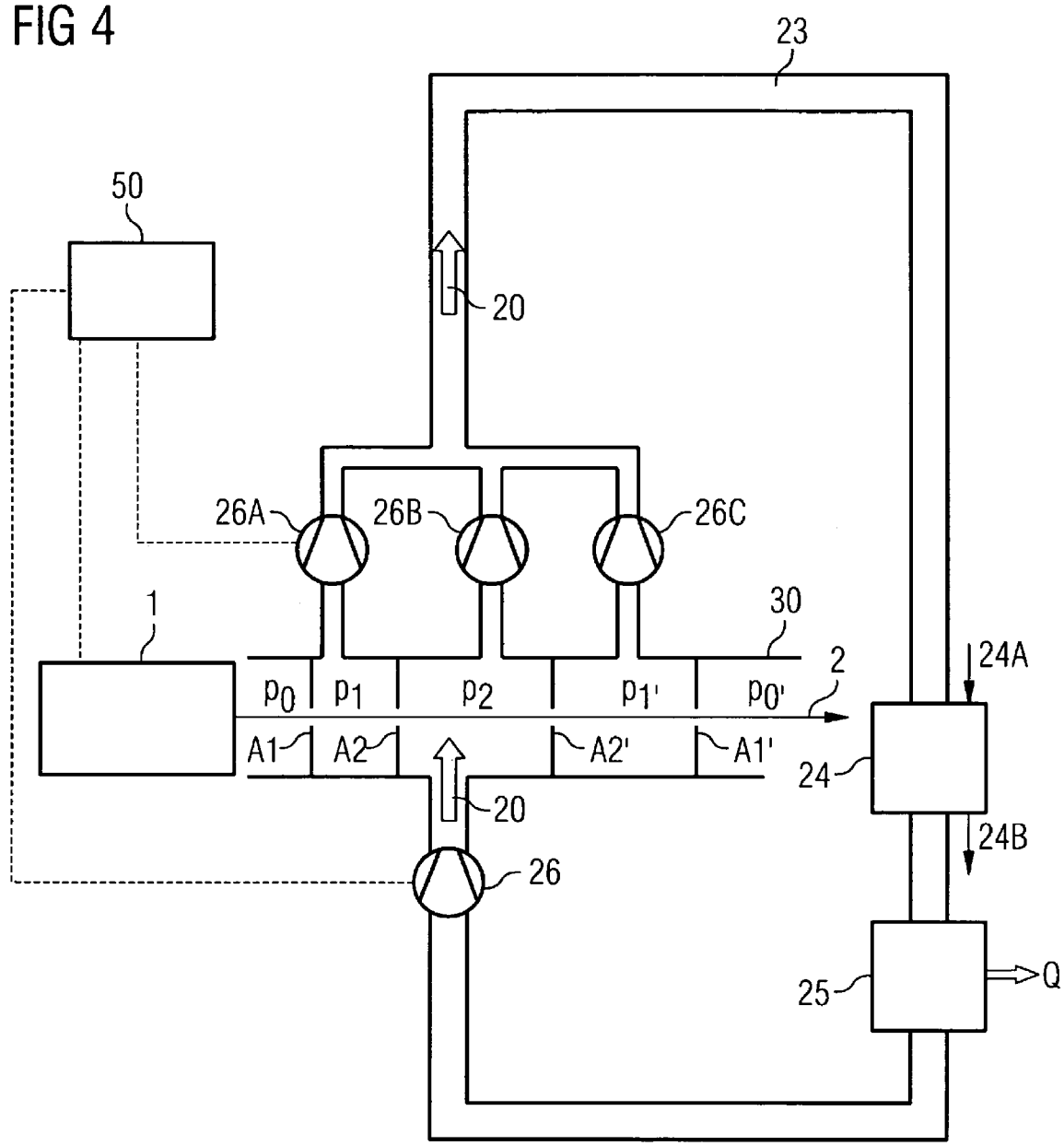
FIG. 4 schematically shows a fifth embodiment being a variation of the first embodiment.

In FIG. 4 a further embodiment is shown. This embodiment directs the absorber gas 20 into the EUV lithographic system by using various apertures A1, A2, A2', A1' connecting spaces having different pressures $p_0, p_1, p_2, p_1', p_0'$ due to differential pumping.

FIG. 4 shows a variation of the setup depicted in FIG. 2, so that reference can be made to the relevant description. Unlike the embodiment in FIG. 2, the light path 2 is directed through a tube like housing 30 which is subdivided by apertures A1, A2, A2', A1' into five compartments. The openings in the apertures A1, A2, A2', A1' are just large enough to let the light beam through. They are especially positioned at places where the light beam is narrow.

The absorber gas flow 20 flows through the middle compartment and is intersected by the light path 2. In addition to the first pump 26, second, third and fourth pumps 26A, 26B, 26C are positioned downstream to the absorber gas flow 20, each of the three pumps 26A, 26B, 26C being connected to three of the compartments in the housing 30. The second pump 26A is connected to the same compartment the absorber gas is discharged by the first pump 26. The highest pressure P2 is present in this compartment. This pressure P2 is chosen to be sufficiently high to allow for absorption of the light.

To the left and the right of this compartment, the pressures $p_1$ $p_1'$ are lower than pressure $p_2$ due to pressure loss at the apertures A2, A2' and the pumping effect of the third and fourth pumps 26B, 26C.

The leftmost and rightmost compartments in the housing contain basically vacuum. Therefore, the pressure differentials are (from left to right in FIG. 4): $p_0 < p_1 < p_2 > p_1' > p_0'$.

The absorber gas 20 leaving the second, third and fourth pumps 26A, 26B, 26C is collected together, recycled and treated as mentioned previously.

The advantage of this system is that the absorber gas 20 is guided by the housing 30 lowering the risk of contamination of mirrors but it is not necessary to have a closed chamber (see FIG. 5) for the absorber gas 20. The differential pumping, i.e. the creation of pressure differences between vacuum and the absorber gas 20 containing compartments confines the absorber gas 20 to a relatively narrow area. By adjusting the pressure levels in the compartments by a computer control 50, the absorption properties of the system can be adjusted. Furthermore, a variant of this embodiment might contain less or more compartments with different pressure levels. In the simplest case just one compartment is used.

Preferably, there is no mirror within the tubular housing 30 to prevent the contamination of the mirror by absorber gas 20.

Figure 5:
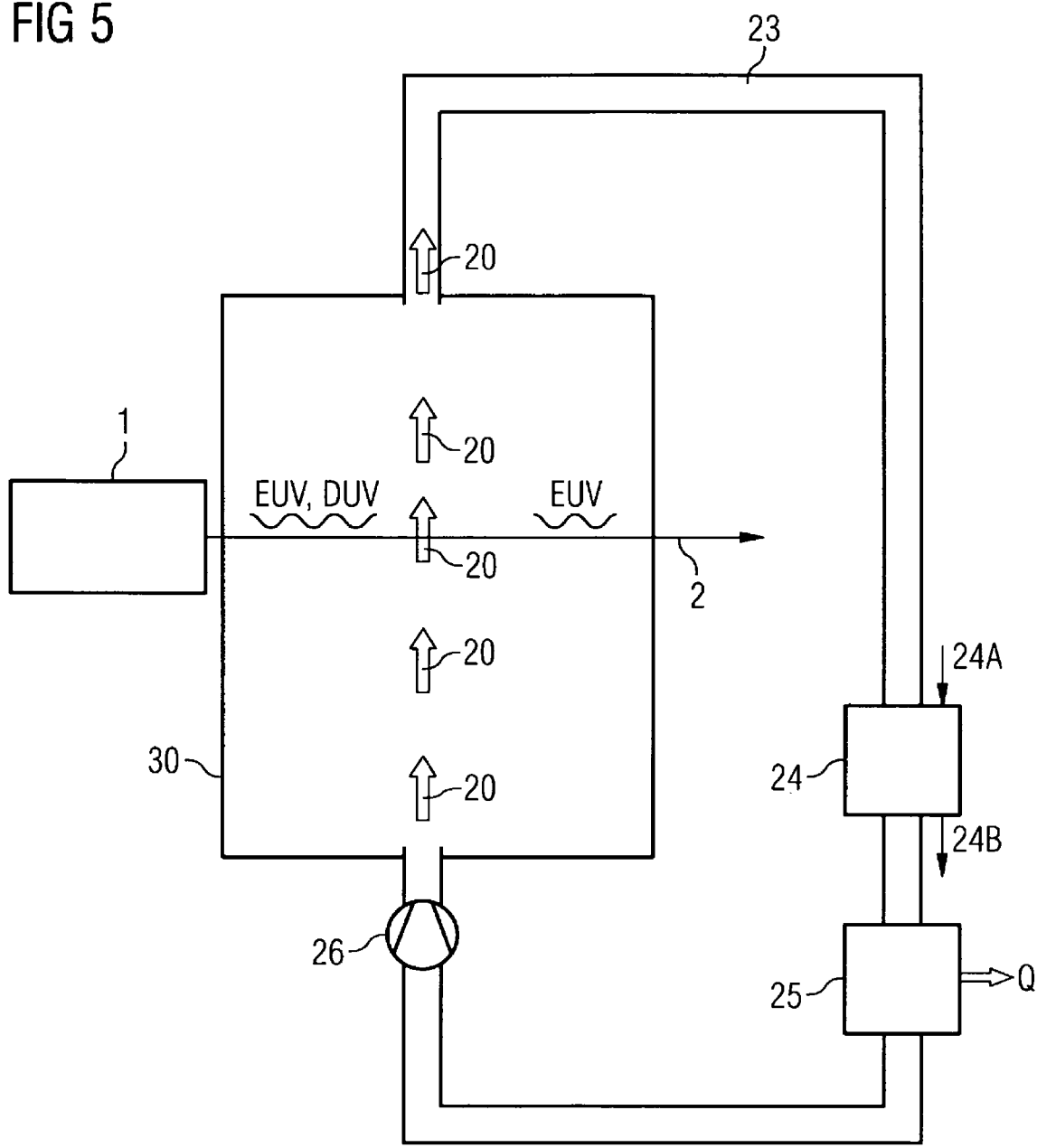
FIG. 5 schematically shows a sixth embodiment of a filter system using a filter chamber.

FIG. 5 shows another embodiment in which the absorber gas 20 flow is not a free flowing gas stream but a stream passing through an absorber chamber 30. The absorber gas chamber 30 has at least one wall made of beryllium in those parts which are subjected to the light of the light source 1. Beryllium is essentially transparent to the light of the light sources 1.

The introduction of the absorber chamber 30 reduces the risk of contaminating the interior of the lithography system. The recycling, cooling, filtering and pumping is facilitated as in the previously mentioned embodiments so that reference is made to the relevant description. Alternatively, the guiding of the absorber gas 20 stream can be enhanced by an electric guiding means 27 as is shown in context with FIG. 3.

Figure 6:
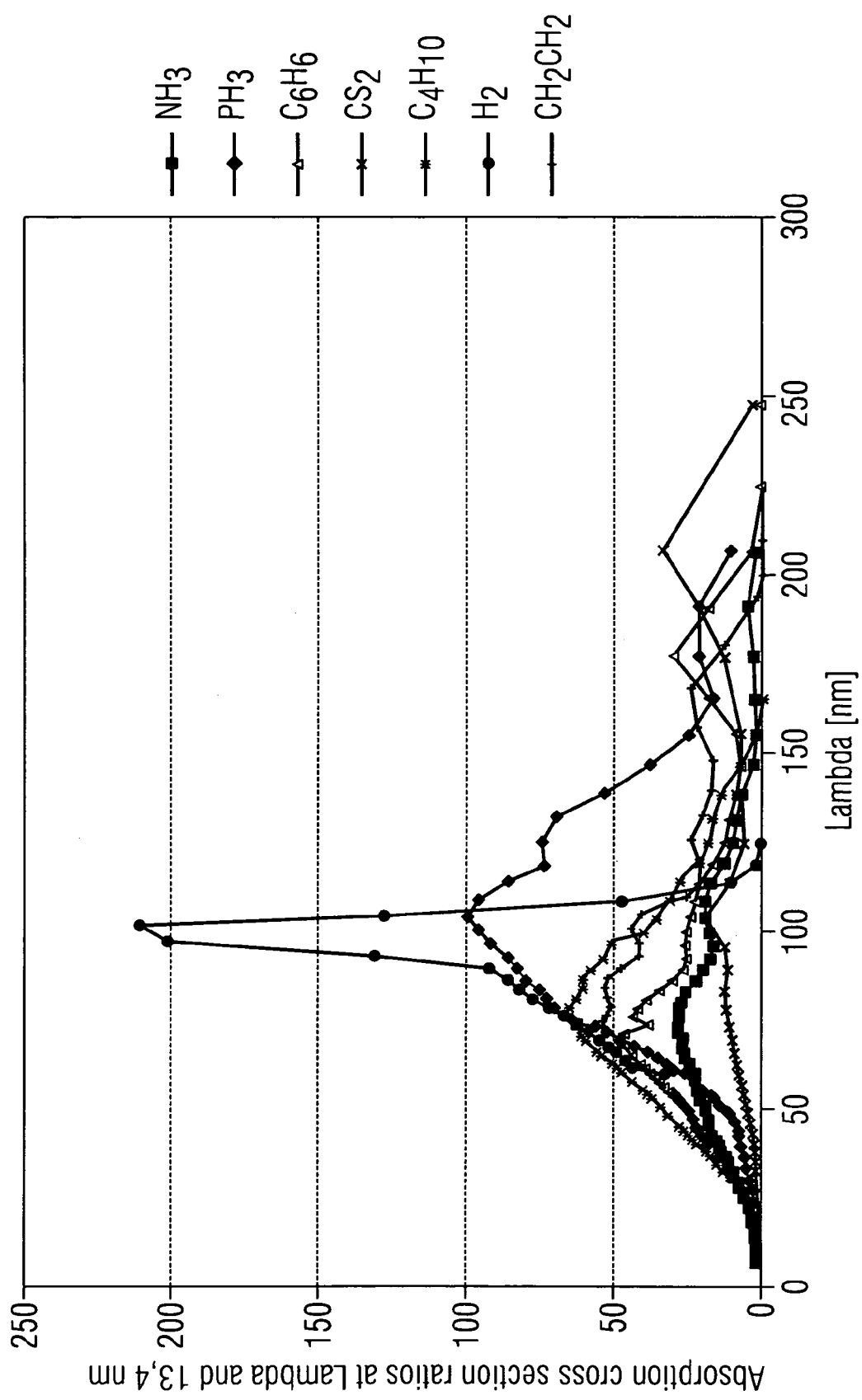
FIG. 6 showing the absorption cross section of different absorber gases.

In FIG. 6 several substances which can be used as absorber gases 20 are characterized. FIG. 6 depicts the absorber cross section ratio at a wavelength λ relative to the absorber cross section at 13.4nm (EUV light). The absorber cross section has been defined above.

In FIG. 5 several substances which can be used as absorber gases 20 are characterized. FIG. 5 depicts the absorber cross section ratio at a wavelength λ relative to the absorber cross section at 13.4 nm (EUV light). The absorber cross section has been defined above.

Phosphine ($PH_3$) shows a significant absorption over the range from 50 to 200 nm so that this particular absorber gas 20 is effective in an embodiment for a filter system. Phosphine can be used alone or in a mixture with other absorber gases.

Another effective absorber gas 20 could be benzene ($C_6H_6$) which is less effective at higher wavelengths, but more effective at lower wavelengths.

An example for a mixture of absorber gases 20 is a mixture of carbon disulfide ($CS_2$) and ethylene ($CH_2CH_2$). Ethylene is more effective at lower wavelengths, carbon disulfide at higher wavelengths.

Figure 7:
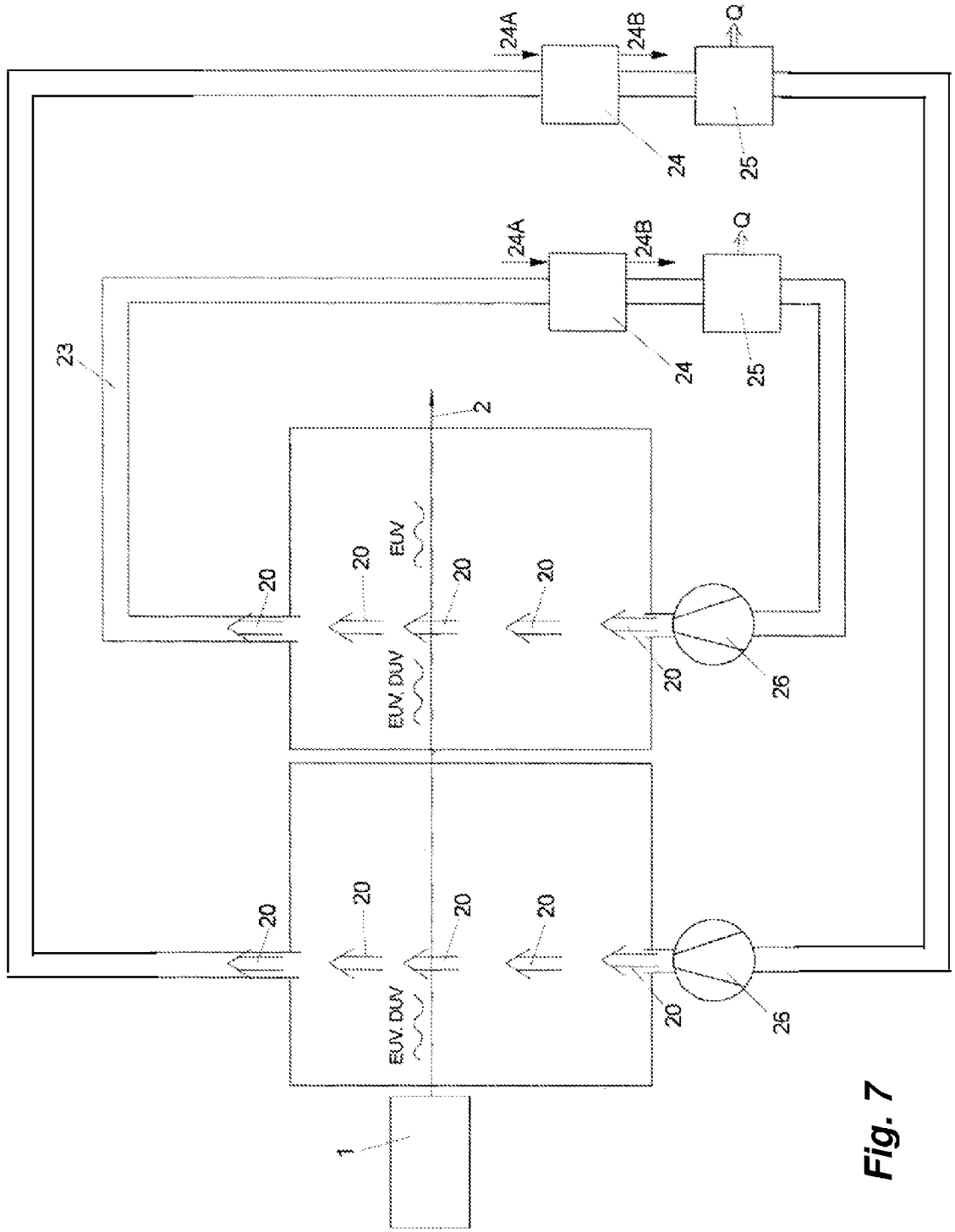
FIG. 7 schematically shows an alternative sixth embodiment of a filter system using a filter chamber.

In another embodiment different absorber gases 20 (such as the ones named above e.g.) are used not in a mixture but in separate chambers in the light path 2 (FIG. 7). Thereby possible interactions of the gases are prevented.

In another embodiment different absorber gases 20 (such as the ones named above e.g.) are used not in a mixture but in separate chambers in the light path 2. Thereby possible interactions of the gases are prevented.

The absorber gas 20 (or the mixture of gases used as an absorber gas 20) is not limited to the species given above, i.e. many other gases are suitable to be used in a filter system according to the invention. It is advantageous that the absorber gas 20 (or the mixture) fulfills at least the following condition:

$$\eta = \frac{\text{Absorption cross section for the at least one wave length interval } \lambda \pm 5 \text{ nm}}{\text{Absorption cross section for a reference wave length of 13.4 nm}} \geq 5$$

The numerator uses the definition for an absorption cross section (e.g. the one given above) for a relatively narrow wavelength band around a particular wavelength.

The denominator provides some reference by comparing the value of the numerator against the wave length of 13.4nm, i.e. the EUV wavelength. If the ratio $\eta \geq 5$ the particular wavelength (including the small band) is five times more efficiently absorbed than the reference wave length. Other advantageous embodiments for the absorber gas have $\eta \geq 10$ or $\eta \geq 20$.

The denominator provides some reference by comparing the value of the numerator against the wave length of 13.4 nm, i.e. the EUV wavelength. If the ratio $\eta \geq 5$ the particular wavelength (including the small band) is five times more efficiently absorbed than the reference wave length. Other advantageous embodiments for the absorber gas have $\eta \geq 10$ or $\eta \geq 20$.

Another criterion for an absorber gas 20, which can be used independently or cumulative with the above definition uses a wavelength dependent spectral exposure efficiencies (SEE).

With an absorber gas, the SEE is defined as:

$$SEE(\lambda) = I(\lambda) \cdot (1 - A(\lambda)) \cdot S(\lambda)$$

Without an absorber gas, the SEE is defined as:

$$SEE_0(\lambda) = I(\lambda) \cdot (1 - A_0(\lambda)) \cdot S(\lambda)$$

With $I(\lambda)$=spectral intensity of the light source 1 (incl. the reflectivity of the mirrors 4A, 4B)

$A(\lambda)$=spectral intensity attenuation along the light path 2 with the absorber gas 20

$A_0(\lambda)$=spectral intensity attenuation along the light path without the absorber gas $S(\lambda)$=sensitivity of the photoresist on the wafer 10

Based in this, a filter efficiency FE can be defined:

$$FE = \frac{\int_{20\,nm}^{250\,nm} SEE_0(\lambda) d\lambda}{\int_{20\,nm}^{250\,nm} SEE(\lambda) d\lambda}$$

Unlike in the above given ratio $\eta$, the integral ratio of SEEs, i.e. the filter efficiency FE factors in the sensitivity of the resist.

Given the definition of FE it is advantageous if the following criterion holds:

$$FE > \frac{SEE_0(13.4 \text{ nm})}{SEE(13.4 \text{ nm})}$$

This means that the integral ratio of the SEE covering a wave length range from 20 to 250 nm is greater than the same SEE evaluated at the reference wave length of 13.4 nm.

Another advantageous criterion for the absorber gas 20 can be based on the SEE:

$$\frac{SEE_0(\lambda)}{SEE(\lambda)} > 5$$

for at least one wavelength in the range between 20 and 250 nm.

What is claimed is:

1. Filter system for a light source in a lithography process for the production of semiconductor devices with a flowing absorber gas for at least one wavelength ($\lambda$) in the range between 20 to 250 nm, the flowing absorber gas intersecting the light path emitted by the light source, wherein the flowing absorber gas has a property to absorb more of the at least one wavelength than a reference wavelength of 13.4 nm, wherein the absorber gas has the property $$\eta = \frac{\text{Absorption cross section for the at least one wave length interval } \lambda \pm 5 \text{ nm}}{\text{Absorption cross section for a reference wave length of 13.4 nm}} \geq 5.$$

2. Filter system according to claim 1, wherein the absorber gas has the property $$\eta = \frac{\text{Absorption cross section for the at least one wave length interval } \lambda \pm 5 \text{ nm}}{\text{Absorption cross section for a reference wave length of 13.4 nm}} \geq 10.$$

3. Filter system according to claim 1, wherein the absorber gas has the property $$\eta = \frac{\text{Absorption cross section for the at least one wave length interval } \lambda \pm 5 \text{ nm}}{\text{Absorption cross section for a reference wave length of 13.4 nm}} \geq 20.$$

4. Filter system according to claim 1, wherein the absorber gas has the property:

$$FE > \frac{SEE_0(13.4 \text{ nm})}{SEE(13.4 \text{ nm})}$$

with the filter efficiency FE defined as $$FE = \frac{\int_{20\,nm}^{250\,nm} SEE_0(\lambda) d\lambda}{\int_{20\,nm}^{250\,nm} SEE(\lambda) d\lambda}$$

with an absorber gas, the SEE is defined as:

$$SEE(\lambda) = I(\lambda) \cdot (1 - A(\lambda)) \cdot S(\lambda)$$

without an absorber gas, the SEE is defined as:

$$SEE_0(\lambda) = I(\lambda) \cdot (1 - A_0(\lambda)) \cdot S(\lambda)$$

and $I(\lambda)$=spectral intensity of the light source (incl. the reflectivity of the mirrors),
$A(\lambda)$=spectral intensity attenuation along the light path 2 with the absorber gas,
$A_0(\lambda)$=spectral intensity attenuation along the light path without the absorber gas,
$S(\lambda)$=sensitivity of the photoresist on a wafer.

5. Filter system according to claim 1, wherein the absorber gas has the property:

$$\frac{SEE_0(\lambda)}{SEE(\lambda)} > 5$$

for at least one wavelength in the range between 20 and 250nm and with an absorber gas, the SEE is defined as:

$$SEE(\lambda) = I(\lambda) \cdot (1 - A(\lambda)) \cdot S(\lambda)$$

without an absorber gas, the SEE is defined as:

$$SEE_0(\lambda) = I(\lambda) \cdot (1 - A_0(\lambda)) \cdot S(\lambda)$$

and $I(\lambda)$=spectral intensity of the light source (incl. the reflectivity of the mirrors),
$A(\lambda)$=spectral intensity attenuation along the light path 2 with the absorber gas,
$A_0(\lambda)$=spectral intensity attenuation along the light path without the absorber gas,
$S(\lambda)$=sensitivity of the photoresist on a wafer.

6. Filter system according to claim 1, wherein the absorber gas comprises at least one of the group of phosphine, benzene, carbon disulfide, ethylene, helium, hydrogen, neon, argon, krypton and xenon.

7. Filter system according to claim 1, wherein the absorber gas is introduced between the light source and a first mirror of a lithography system.

8. Filter system according to claim 1, wherein the absorber gas is a gas stream intersecting the light path.

9. Filter system according to claim 1, wherein the absorber gas flows with a drift velocity which is at least as high as the thermal velocity of molecules in one direction in the absorber gas given by $$v_{thermal} = \sqrt{\frac{RT}{M}}.$$

10. Filter system according to claim 9, wherein the cone angle of the flowing absorber gas is defined by $$coneangle = 2 * \arctan\left(\frac{v_{thermal}}{v_{drift}}\right),$$

wherein the coneangle is less than 45°.

11. Filter system according to claim 1, wherein the absorber gas is recycled after the absorption process.

12. Filter system according to claim 1, wherein the absorber gas is cooled after it passed through the light path.

13. Filter system according to claim 1, wherein the light path passes at least partially through a vacuum.

14. Filter system according to claim 1, wherein the absorber gas is filtered after it passed through the light path.

15. Filter system according to claim 1, wherein the absorber gas flow is perpendicular to the light path.

16. Filter system according to claim 1, wherein the absorber gas flow is maintained by a pump system.

17. Filter system according to claim 1, wherein the absorber gas flow is pulsed, especially pulsed in synchrony with the light source.

18. Filter system according to claim 1, wherein the flowing absorber gas is ionized and collected by a collector comprising an electrical apparatus for collecting an ionized absorber gas.

19. Filter system according to claim 1, wherein the absorber gas flow is a free flow intersecting the light path.

20. Filter system according to claim 19, wherein the flowing absorber gas is collected by collector means after intersecting the light path.

21. Filter system according to claim 19, wherein the flowing absorber gas is collected by catch plates.

22. Filter system according to claim 1, wherein the absorber gas is flowing through at least one filter chamber positioned in the light path.

23. Filter system according to claim 22, wherein the at least one filter chamber comprises a container at least partially made of beryllium.

24. Filter system according to claim 1, wherein the absorber gas is flowing through at least two filter chambers positioned in the light path, and wherein the at least two of the filter chambers contain different absorber gases.

25. Filter system according to claim 1, wherein the light path is going through at least one chamber filled with absorber gas at pressure level different from the surrounding.

26. Filter system according to claim 25, wherein at least one pump is connected to the at least one chamber to control the pressure level in said at least one chamber.

27. Filter system according to claim 26, wherein at least one pump is connected to a plurality of chambers, each of the chambers having a different pressure level than the neighboring chamber.

28. Filter system according to claim 1, wherein the light source is a plasma source for the use in an EUV lithography process, in particular a light source generated by a laser.

29. Filter system according to claim 1, wherein the semiconductor device is at least one of the groups of volatile memory chip, non-volatile memory chip, DRAM memory chip and microprocessor.

30. Filter system according to claim 1, wherein the absorber gas is distributed throughout a closed lithography equipment.

31. Filter system according to claim 30, wherein the absorber gas is selectively removed from certain parts of the lithography equipment, in particular mirrors.

32. Filter system according to claim 1, wherein absorber gas is recycled and filtered by a filter unit.

33. Lithography apparatus for processing semiconductor substrates with at least one filter system according to claim 1.

34. Lithography apparatus for processing semiconductor substrates, comprising
a light source capable of emitting EUV light;
a plurality of mirrors for directing the light to the semiconductor substrate;
means for introducing and removing the semiconductor substrates, whereby the path of the light passes through an area filled with an absorber gas, wherein the absorber gas has a property to absorb more light at a wavelength other than a reference wavelength than the reference wavelength of 13.4nm, wherein the absorber gas has the property $$\eta = \frac{\text{Absorption cross section for the at least one wave length interval } \lambda \pm 5 \text{ nm}}{\text{Absorption cross section for a reference wave length of 13.4 nm}} \geq 5.$$

35. Method for filtering light emitted by a light source in a lithography process for the production of semiconductor devices with a flowing absorber gas for at least one wavelength (λ) in the range between 20to 250nm, the flowing absorber gas intersecting the light path emitted by the light source, wherein the flowing absorber gas has a property to absorb more of the at least one wavelength than a reference wavelength of 13.4nm, wherein the absorber gas has the property $$\eta = \frac{\text{Absorption cross section for the at least one wave length interval } \lambda \pm 5 \text{ nm}}{\text{Absorption cross section for a reference wave length of 13.4 nm}} \geq 5.$$

36. Method according to claim 35, wherein
a) the light source provides a light beam for structuring a wafer, the light beam being reflected by a plurality of mirrors and at least one reflective mask, whereby a projected image is transferred from the mask to a resist on the wafer forming a pattern in the resist,
b) the resist pattern is transferred into the wafer by an etching process, in particular a reactive ion etching process, followed by
c) a removal of the resist.

37. Semiconductor device manufactured by a method according to claim 35.

* * * * *